United States Patent
Chiang et al.

(10) Patent No.: US 8,461,614 B2
(45) Date of Patent: Jun. 11, 2013

(54) PACKAGING SUBSTRATE DEVICE, METHOD FOR MAKING THE PACKAGING SUBSTRATE DEVICE, AND PACKAGED LIGHT EMITTING DEVICE

(75) Inventors: Wen-Chung Chiang, Lujhu Township (TW); Keng-Chung Wu, Lujhu Township (TW); Ying-Chi Hsieh, Lujhu Township (TW); Cheng-Kang Lu, Lujhu Township (TW); Ming-Huang Fu, Lujhu Township (TW)

(73) Assignee: Tong Hsing Electronic Industries, Ltd., Taipei (TW)

( * ) Notice: Subject to any disclaimer, the term of this patent is extended or adjusted under 35 U.S.C. 154(b) by 655 days.

(21) Appl. No.: 12/753,371

(22) Filed: Apr. 2, 2010

(65) Prior Publication Data

US 2010/0258838 A1  Oct. 14, 2010

(30) Foreign Application Priority Data

Apr. 13, 2009  (TW) .............................. 98112167 A

(51) Int. Cl.
*H01L 33/00* (2010.01)

(52) U.S. Cl.
USPC ................ 257/99; 257/700; 216/33; 156/60; 156/252; 156/272.8; 156/280; 174/252; 174/257; 174/258; 427/98.3; 430/319; 29/592.1; 29/890.03; 438/25; 438/106; 438/455; 438/456; 438/457

(58) Field of Classification Search
None
See application file for complete search history.

(56) References Cited

U.S. PATENT DOCUMENTS

| | | | | |
|---|---|---|---|---|
| 5,153,986 | A * | 10/1992 | Brauer et al. .................... | 29/846 |
| 6,066,219 | A * | 5/2000 | Schulz-Harder et al. .. | 156/89.11 |
| 6,660,942 | B2 * | 12/2003 | Horiuchi et al. .............. | 174/258 |
| 6,835,895 | B1 * | 12/2004 | Asai et al. ..................... | 174/255 |
| 2003/0068537 | A1 * | 4/2003 | Tsukaguchi et al. .......... | 428/901 |
| 2004/0023011 | A1 * | 2/2004 | Sumi et al. .................... | 428/210 |
| 2007/0261778 | A1 * | 11/2007 | Schulz-Harder et al. .. | 156/89.18 |
| 2007/0290307 | A1 * | 12/2007 | Lin ................................ | 257/678 |
| 2009/0152237 | A1 * | 6/2009 | Chiang et al. .................. | 216/33 |
| 2010/0236819 | A1 * | 9/2010 | Chiang et al. ................. | 174/257 |
| 2010/0288536 | A1 * | 11/2010 | Chiang .......................... | 174/252 |
| 2010/0288537 | A1 * | 11/2010 | Chiang et al. ................. | 174/252 |
| 2011/0079418 | A1 * | 4/2011 | Furuichi et al. ............... | 174/257 |

* cited by examiner

*Primary Examiner* — Julio J. Maldonado
*Assistant Examiner* — Shantanu C Pathak
(74) *Attorney, Agent, or Firm* — Occhiuti Rohlicek & Tsao LLP

(57) ABSTRACT

A packaging substrate device includes: a first laminate including a first ceramic substrate and a first copper pattern disposed on an upper surface of the first ceramic substrate; and a second laminate disposed over the first copper pattern and including a second ceramic substrate, a second copper pattern that is disposed on an upper surface of the second ceramic substrate, and a through hole extending through the second ceramic substrate and the second copper pattern to expose a copper portion of the first copper pattern. A light emitting semiconductor die can be mounted on the copper portion within the through hole. Efficient heat dissipation can be achieved through the first laminate.

11 Claims, 5 Drawing Sheets

PACKAGING SUBSTRATE DEVICE, METHOD FOR MAKING THE PACKAGING SUBSTRATE DEVICE, AND PACKAGED LIGHT EMITTING DEVICE

CROSS-REFERENCE TO RELATED APPLICATION

This application claims priority of Taiwanese application no. 098112167, filed on Apr. 13, 2009.

BACKGROUND OF THE INVENTION

1. Field of the Invention

This invention relates to a package device and a method for making the same, more particularly to a packaging substrate device, which has relatively high heat dissipation efficiency and is suitable for a chip on board (COB) packaging process, a method for making the packaging substrate device, and a packaged light emitting device.

2. Description of the Related Art

During emission of light, light emitting diodes (LEDs) can generate considerable heat that affects adversely the lifetime and power efficiency of the LEDs. When the temperature of the LEDs is increased to above 100° C., the lifetime and power efficiency of the LEDs will be reduced rapidly. Thus, it is necessary to package the LEDs by using package devices with better heat dissipation efficiency to prolong the LEDs' lifetime and to maintain high power efficiency of the LEDs.

In order to increase the heat dissipation efficiency, packaging substrate devices are commonly used nowadays. In a process for packaging a high-power LED using a packaging substrate device, a LED die is first mounted on a heat dissipation sheet using solder paste or heat dissipation paste to reduce a thermal resistance of the packaging substrate device. Then, the heat dissipation sheet is mounted onto a heat dissipation substrate using solder paste or heat dissipation paste such that the heat of the heat dissipation sheet can be transferred to the heat dissipation substrate. Generally, a heat dissipation sheet with large thickness has an efficient heat dissipation efficiency. A heat dissipation substrate associated with such a heat dissipation sheet must be able to dissipate heat rapidly and must possess sufficient structural strength in order to efficiently dissipate heat to the outside. Commonly used heat dissipation substrates include metal core printed circuit boards (MCPCB) and ceramic substrates.

With increasing development of LED technologies, the power efficiency of the LEDs is getting higher and higher. Thus, there is a need to develop a packaging substrate device with a reduced thermal resistance between the LED die and the substrate.

SUMMARY OF THE INVENTION

Therefore, an object of the present invention is to provide a packaging substrate device, which has relatively high heat dissipation efficiency and is suitable for a Chip on board (COB) packaging process.

Another object of the present invention is to provide a method for making the packaging substrate device.

Yet another object of the present invention is to provide a packaged light emitting device including the packaging substrate device.

According to one aspect of this invention, a packaging substrate device comprises:

a first laminate including a first ceramic substrate and a first copper pattern disposed on an upper surface of the first ceramic substrate; and a second laminate disposed over the first copper pattern and including a second ceramic substrate, a second copper pattern that is disposed on an upper surface of the second ceramic substrate, and a through hole extending through the second ceramic substrate and the second copper pattern to expose a copper portion of the first copper pattern.

Preferably, the first laminate further includes a backside copper layer covering a lower surface of the first ceramic substrate.

Furthermore, the packaging substrate device further comprises a conductive mass disposed in the through hole to electrically connect to the copper portion of the first copper pattern. The conductive mass should be made of a material with excellent electrical conductivity and thermal conductivity, is preferably a copper mass, and is eutectic bonded to the first copper pattern.

The first and second copper patterns are made of copper or a copper alloy that can be eutectic bonded to the ceramic substrates. The first and second ceramic substrates can be made of, for example, $Al_2O_3$, AlN, $TiO_2$, $SiO_2$, $ZrO_2$, ZnO, $2MgO.SiO_2$, or $BaTiO_3$, and are preferably made of $Al_2O_3$ or AlN.

The packaging substrate device of the present invention is especially suitable for a vertical type LED die. In the packaging substrate device, the first and second copper patterns are electrically isolated from each other by using the second ceramic substrate. A semiconductor die can be packaged in the packaging substrate device by COB packaging, and has a first electrode electrically connected to the first copper pattern and a second electrode wire-bonded to the second copper pattern. Therefore, the light emitting diode can electrically connect to outer circuits using the packaging substrate device of this invention.

Furthermore, the semiconductor die can be mounted in the through hole and directly bonded to the first copper pattern. Therefore, the heat generated by the semiconductor die can be transferred to the first copper pattern, the first ceramic substrate and the backside copper layer for dissipation. Moreover, since the packaging substrate device according to the present invention is provided without using the solder paste or the heat dissipation paste, the heat dissipation efficiency of the packaging substrate device can be enhanced.

Besides, by provision of the conductive mass, the distance for wire-bonding the semiconductor die to the second copper pattern can be shortened.

According to another aspect of this invention, a method for making a packaging substrate device comprises:

(a) patterning a first copper layer covering an upper surface of a first ceramic substrate of a first laminate to form a first copper pattern on the upper surface of the first ceramic substrate;

(b) patterning a second copper layer covering an upper surface of a second ceramic substrate of a second laminate to form a second copper pattern on the upper surface of the second ceramic substrate;

(c) forming a through hole to extend through the second laminate for receiving an electronic element;

(d) placing the second laminate onto the first laminate such that the second ceramic substrate is in contact with the first copper pattern; and (e) heating the first and second laminates such that the first copper pattern is bonded to the second ceramic substrate.

According to yet another aspect of this invention, a packaged light emitting device comprises:

a first laminate including a first ceramic substrate and a first copper pattern disposed on an upper surface of the first ceramic substrate;

a second laminate disposed over the first copper pattern and including a second ceramic substrate, a second copper pattern that is disposed on an upper surface of the second ceramic substrate, and a through hole extending through the second ceramic substrate and the second copper pattern to expose a copper portion of the first copper pattern; and a semiconductor die mounted on the copper portion of the first copper pattern, and having a first electrode electrically connected to the first copper pattern and a second electrode wire-bonded to the second copper pattern.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1A:
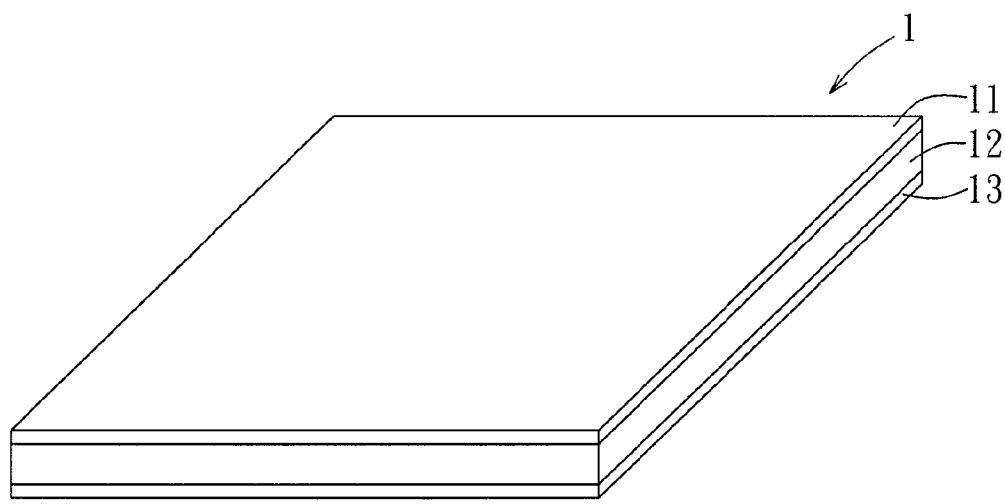
FIGS. 1(a) and 1(b) show a first laminate before and after a patterning step of a method for making a packaging substrate device according to the first embodiment of the present invention.

Before the present invention is described in greater detail with reference to the accompanying preferred embodiments, it should be noted herein that like elements are denoted by the same reference numerals throughout the disclosure.

A method for making a packaging substrate device according to the first embodiment of the present invention will be described hereinafter with reference to FIGS. 1 to 4.

The method for making the packaging substrate device 100 (FIG. 4) includes: (i) patterning a first laminate 1 (FIG. 1(b)); (ii) patterning a second laminate 2 (FIGS. 2(b) and 2(c)); (iii) forming a through hole 221 (FIG. 3) to extend through the second laminate 2 for receiving an electronic element (i.e., a semiconductor die 3 shown in FIG. 5); (iv) placing the second laminate 2 onto the patterned first laminate 1; and (v) heating and bonding the patterned first and second laminates 1 and 2 to each other.

Referring to FIG. 1(a), the first laminate 1 includes a first ceramic substrate 12, a first copper layer 11 covering an upper surface of the first ceramic substrate 12, and a first backside copper layer 13 covering a lower surface of the first ceramic substrate 12. The first laminate 1 may be a commercially available product, or may be made using a direct bonding copper method.

Figure 1B:
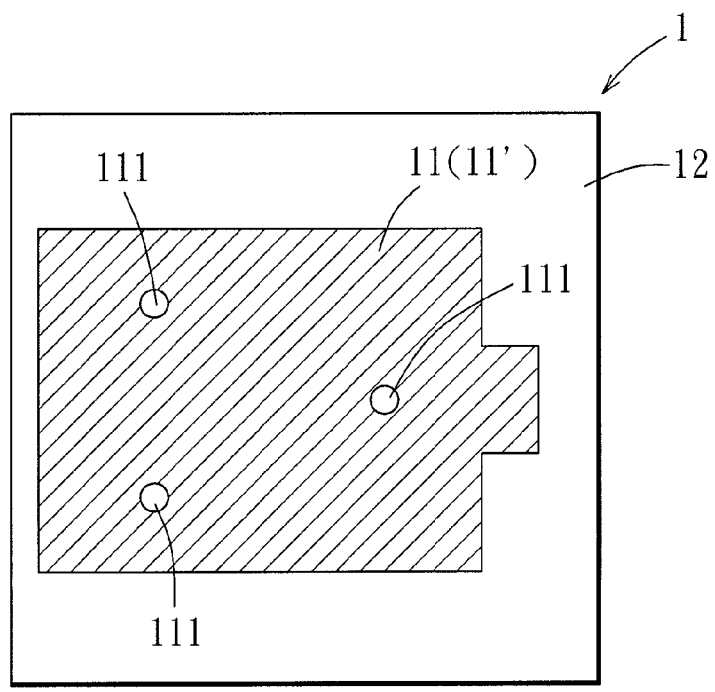

As shown in FIG. 1(b), the first copper layer 11 is patterned to form a first copper pattern 11' on the upper surface of the first ceramic substrate 12 and to form three first positioning elements 111 in a region of the first copper pattern 11'. In this embodiment, the first positioning elements 111 are circular recesses. Details concerning the patterning of the copper layer 11 are omitted herein since the patterning can be conducted using any conventional PCB lithography process and etching process.

Figure 2A:
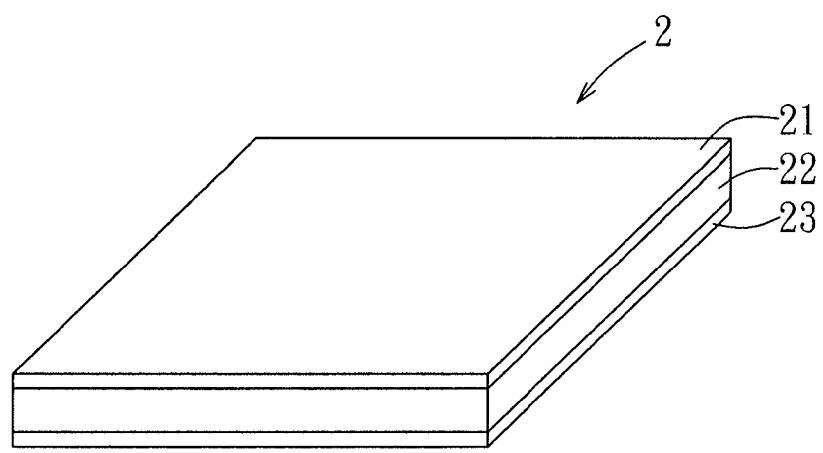
FIGS. 2(a) to 2(c) show a second laminate before and after a patterning step of a method for making a packaging substrate device according to the first embodiment of the present invention.

Referring to FIG. 2(a), the second laminate 2 includes a second ceramic substrate 22, a second copper layer 21 covering an upper surface of the second ceramic substrate 22, and a second backside copper layer 23 covering a lower surface of the second ceramic substrate 22. The second laminate 2 is prepared using a direct bonding copper method.

In the preferred embodiment, the second laminate 2 has an area smaller than that of the first laminate 1, and the first and second ceramic substrates 12 and 22 are made of aluminum oxide.

Figure 2B:
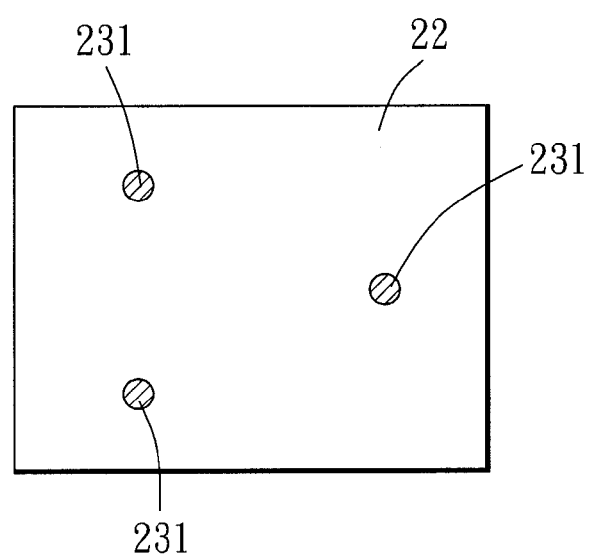
Figure 2C:
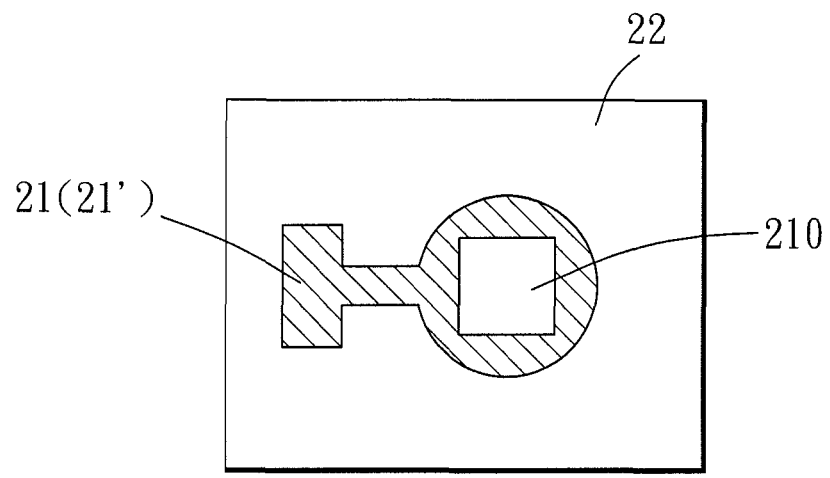

As shown in FIGS. 2(b) and 2(c), the second copper layer 21 is patterned to form a second copper pattern 21' on the upper surface of the second ceramic substrate 12, and the second backside copper layer 23 is patterned to form three second positioning elements 231 on the lower surface of the second ceramic substrate 22. Each second positioning element 231 is in a form of a circular protrusion for interference fit with the circular recess of the first positioning element 111. Alternatively, the second positioning elements 231 may be square or triangular protrusions when the first positioning elements 111 are square or triangular. The second positioning elements 231 may also be formed as recesses when the first positioning elements 111 are protrusions. The height of the protrusions of the second positioning elements 231 is substantially equal to the depth of the recesses of the first positioning elements 111. The second positioning elements 231 can be respectively placed in the first positioning elements 111 on the first ceramic substrate 12.

In other embodiments, the protrusions of the second positioning elements 231 can be replaced by three pillars (not shown) made of ceramic or copper. In this case, the lower surface of the second ceramic substrate 22 is formed with recesses that can be respectively aligned with the recesses of the first positioning elements 111. Then, each pillar can be placed between the recesses of the first and second positioning elements 111, 231.

The patterning of the second copper layer 21 and the second backside copper layer 23 may be conducted by conventional PCB lithography process and etching process.

Figure 3:
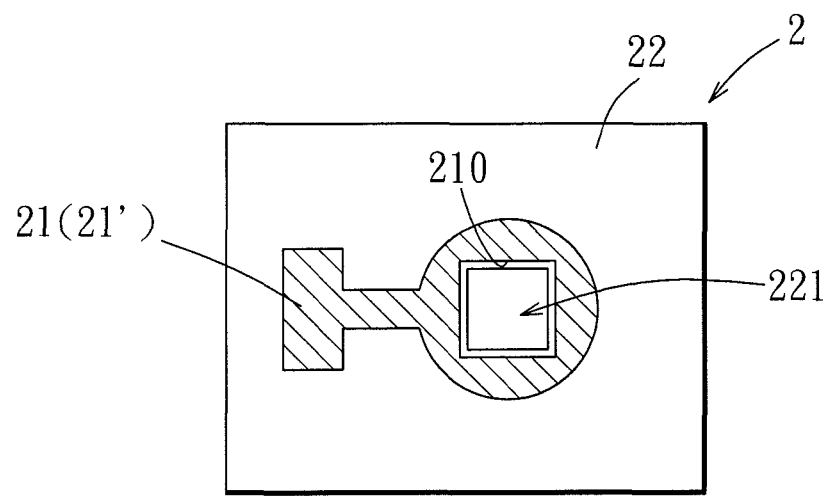
FIG. 3 shows the second laminate of FIG. 2(c) after a through hole forming step according to the first embodiment of the present invention.

Referring to FIG. 3 in combination with FIG. 2(c), the through hole 221 is formed in an etched region 210 of the second copper pattern 21'. In this embodiment, the copper in the etched region 210 of the second copper pattern 21' is removed during the patterning of the second copper layer 21 to expose the second ceramic substrate 22 as shown in FIG. 2(c), followed by forming the through hole 221 through the etched region 210 by a laser drilling process.

Preferably, for ensuring that a portion of the second copper pattern 21' around the through hole 221 is electrically isolated from the first copper pattern 11', the through hole 221 is provided with a size smaller than that of the etched region 210 of the second copper pattern 21'.

The positions and number of the through holes 221 can be varied based on the design requirements, and should not be limited to this embodiment.

Figure 4:
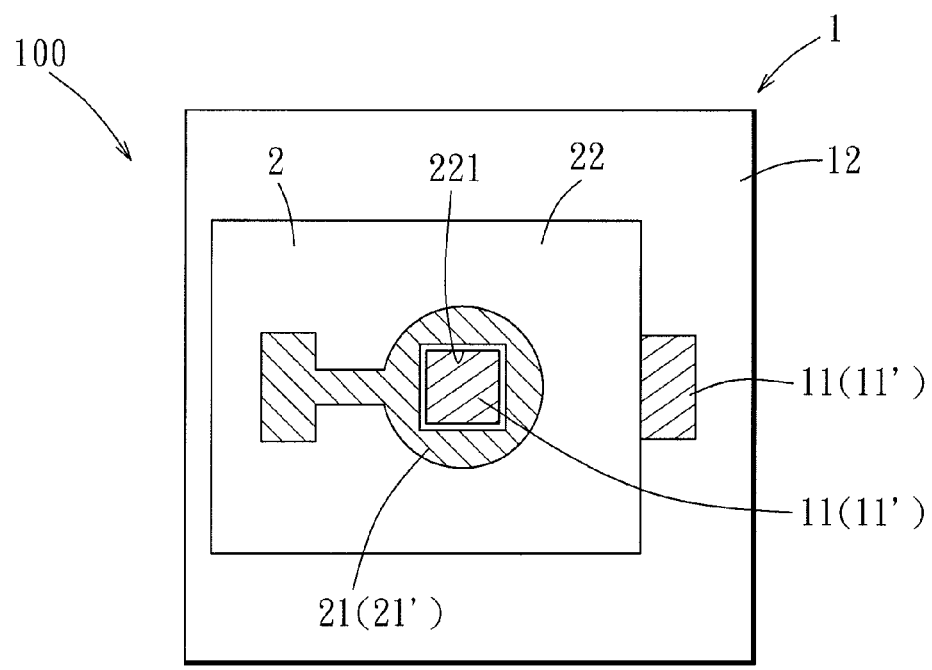
FIG. 4 is a top view of the packaging substrate device according to the first embodiment of the present invention.

Referring to FIG. 4, the second laminate 2 is stacked on the first laminate 1 such that a copper portion of the first copper pattern 11' is exposed from the through hole 221. The second laminate 2 can be prevented from sliding relative to the first laminate 1 since the protrusions of the second positioning elements 231 are placed in interference fit with the respective recesses of the first positioning elements 111. The second laminate 2 shields and contacts a large part of the first copper pattern 11', and only a small part of the first copper pattern 11' for electrical outlet connection is exposed from the through hole 221.

The stack of the first and second laminates 1 and 2 is placed in a high temperature furnace at an atmosphere having oxygen content lower than 10 ppm to conduct a direct copper bonding (DCB) process at a temperature that is lower than the melting point of copper (about 1083° C.) and higher than the eutectic temperature of the copper-copper oxide eutectic (1063° C.)

The packaging substrate device 100 shown in FIG. 4 can be used for packaging a semiconductor die, especially a vertical type semiconductor LED die.

Figure 5:
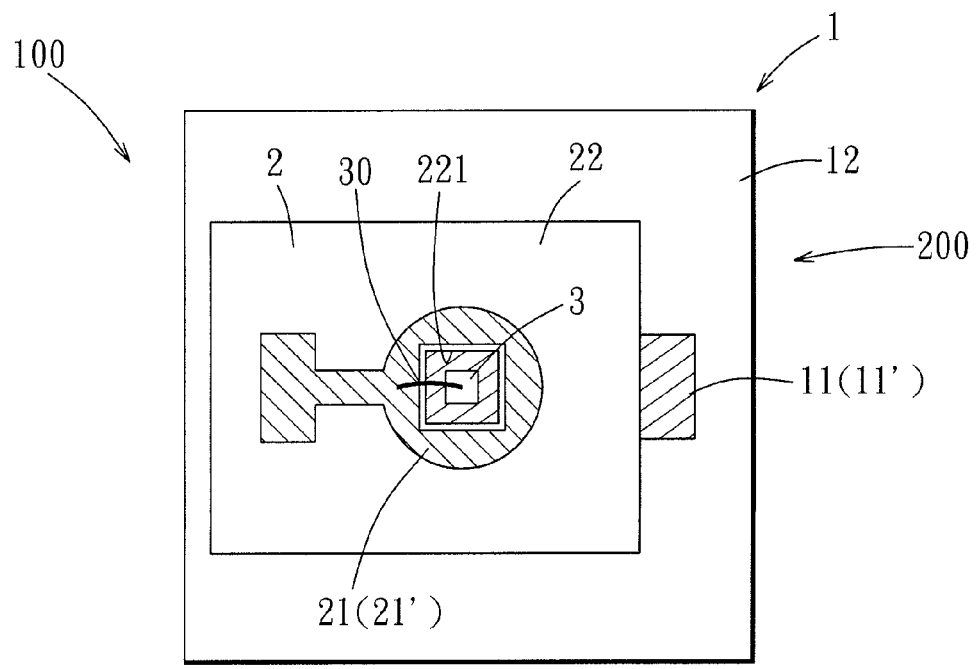
FIG. 5 is a top view of a packaged light emitting device according to the first embodiment of the present invention.

Referring to FIG. 5, a packaged light emitting device 200 according to the first embodiment of the present invention is shown to include the packaging substrate device 100 of FIG. 4 and a vertical type light emitting semiconductor die 3.

The light emitting semiconductor die 3 is disposed in the through hole 221, and is directly mounted on the copper portion of the first copper pattern 11' using a COB packaging process. The semiconductor die 3 has a first electrode (not shown) electrically connected to the first copper pattern 11' and a second electrode wire-bonded to the second copper pattern 21' via a bonding wire 30. Because the first and second copper patterns 11', 21' are electrically isolated from each other by the second ceramic substrate 22, a short circuit between the first electrode and the bonding wire 30 can be prevented. The distance for wire-bonding the semiconductor die 3 can be reduced through the use of the multi-layered structure of the present invention. The packaged light emitting device 200 can further include an encapsulation resin layer, a fluorescent layer, a lens, etc., based on the design of the packaged light emitting device 200. In an embodiment, a transparent encapsulation resin is filled in a space confined by the through hole 221 and the first copper layer 11.

Figure 6:
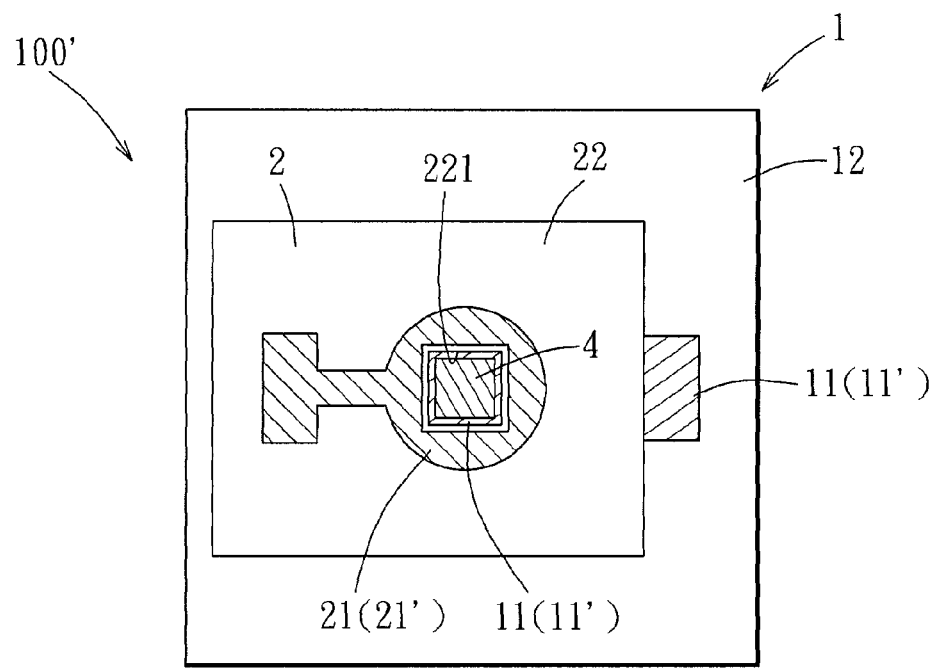
FIG. 6 is a top view of the packaging substrate device according to the second embodiment of the present invention.

FIG. 6 illustrates a packaging substrate device 100' according to the second embodiment of the present invention. The second embodiment differs from the first embodiment only in that the packaging substrate device 100' further includes a conductive mass (copper mass) 4, which is disposed in the through hole 221 to electrically connect to the copper portion of the first copper pattern 11' and which is electrically isolated from the second copper pattern 21'. The conductive mass 4 can be placed in the through hole 221 and on the copper portion of the first copper pattern 11' prior to the heating of the first and second laminates 1 and 2 so that it is mounted to the copper portion of the first copper pattern 11'. Thereafter, the semiconductor die 3 (see FIG. 7) is mounted on the conductive mass 4 in this embodiment. Preferably, the conductive mass 4 is co-planar with the second copper pattern 21' such that the bonding wire 30 that bonds the semiconductor die 3 to the second copper pattern 21' can be shortened. Alternatively, the conductive mass 4 can be lower or higher than the second copper layer 21.

Figure 7:
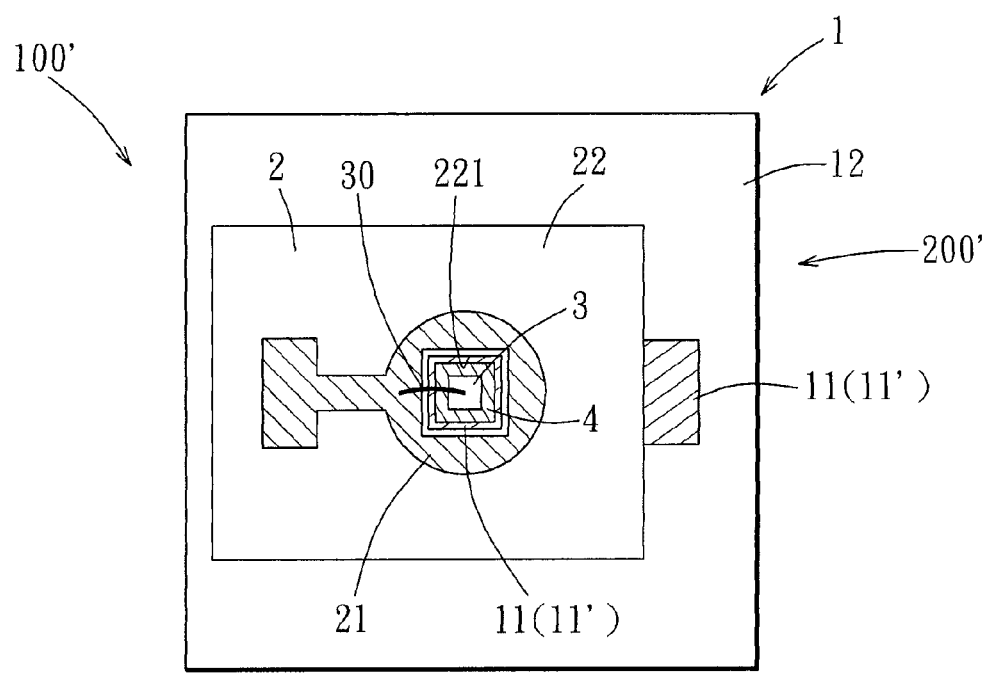
FIG. 7 is a top view of a packaged light emitting device according to the second embodiment of the present invention.

FIG. 7 illustrates a packaged light emitting device 200' according to the second embodiment of the present invention. The packaged light emitting device 200' according to the second embodiment of the present invention is shown to include the packaging substrate device 100' of FIG. 6 and a light emitting semiconductor die 3 that is mounted on the conductive mass 4.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A packaging substrate device, comprising:
   a first laminate including a first ceramic substrate and a first copper pattern disposed on an upper surface of said first ceramic substrate; and
   a second laminate disposed over said first copper pattern and including a second ceramic substrate, a second copper pattern that is disposed on an upper surface of said second ceramic substrate, and a through hole extending through said second ceramic substrate and said second copper pattern to expose a copper portion of said first copper pattern.

2. The packaging substrate device of claim 1, wherein said second laminate has an area smaller than that of said first laminate such that a part of said first copper pattern is exposed from said second laminate.

3. The packaging substrate device of claim 1, wherein said first laminate further includes a backside copper layer covering a lower surface of said first ceramic substrate.

4. The packaging substrate device of claim 1, further comprising a conductive mass disposed in said through hole to electrically connect to said copper portion of said first copper pattern.

5. The packaging substrate device of claim 4, wherein said conductive mass is a copper mass.

6. The packaging substrate device of claim 1, wherein said through hole extends through an etched region of said second copper pattern.

7. The packaging substrate device of claim 1, wherein said first copper pattern has a region provided with a first positioning element, and said second ceramic substrate is bonded to said region.

8. The packaging substrate device of claim 7, wherein said second laminate has a second positioning element on a lower surface of said second ceramic substrate for interference fit with said first positioning element.

9. The packaging substrate device of claim 8, wherein said first positioning element is a recess, and said second positioning element is a protrusion.

10. A packaged light emitting device, comprising:
    a first laminate including a first ceramic substrate and a first copper pattern disposed on an upper surface of said first ceramic substrate;
    a second laminate disposed over said first copper pattern and including a second ceramic substrate, a second copper pattern that is disposed on an upper surface of said second ceramic substrate, and a through hole extending through said second ceramic substrate and said second copper pattern to expose a copper portion of said first copper pattern; and
    a semiconductor die mounted on said copper portion of said first copper pattern within said through hole, and having a first electrode electrically connected to said first copper pattern and a second electrode wire-bonded to said second copper pattern.

11. The packaged light emitting device of claim 10, further comprising a conductive mass disposed in said through hole to electrically connect to said copper portion of said first copper pattern, said semiconductor die being disposed on said conductive mass, said first electrode being electrically connected to said conductive mass.

* * * * *